(12) United States Patent
Yang et al.

(10) Patent No.: US 9,866,021 B2
(45) Date of Patent: Jan. 9, 2018

(54) LOAD POWER DEVICE, SYSTEM AND METHOD OF LOAD CONTROL AND MANAGEMENT EMPLOYING LOAD IDENTIFICATION

(71) Applicant: EATON CORPORATION, Cleveland, OH (US)

(72) Inventors: Yi Yang, Milwaukee, WI (US); Charles John Luebke, Hartland, WI (US); Thomas J. Schoepf, Stuttgart (DE)

(73) Assignee: EATON CORPORATION, Cleveland, OH (US)

( * ) Notice: Subject to any disclaimer, the term of this patent is extended or adjusted under 35 U.S.C. 154(b) by 466 days.

(21) Appl. No.: 14/564,796

(22) Filed: Dec. 9, 2014

(65) Prior Publication Data

US 2016/0164288 A1   Jun. 9, 2016

(51) Int. Cl.
| | |
|---|---|
| H02J 13/00 | (2006.01) |
| G01R 19/25 | (2006.01) |
| H02J 3/14 | (2006.01) |
| H02J 3/00 | (2006.01) |
| G01R 21/06 | (2006.01) |

(52) U.S. Cl.
CPC .......... *H02J 3/005* (2013.01); *G01R 19/2513* (2013.01); *G01R 21/06* (2013.01); *H02J 3/14* (2013.01); *H02J 13/0006* (2013.01); *H02J 2003/143* (2013.01); *Y02B 70/3216* (2013.01); *Y02B 70/3225* (2013.01); *Y02B 70/3241* (2013.01); *Y02B 70/3266* (2013.01); *Y02B 90/226* (2013.01); *Y04S 20/222* (2013.01); *Y04S 20/242* (2013.01)

(58) Field of Classification Search
CPC . H02J 13/0006; G01R 19/2513; G01R 21/06; Y02B 70/3216; Y02B 70/3241; Y02B 90/226; Y02B 90/244
See application file for complete search history.

(56) References Cited

U.S. PATENT DOCUMENTS

| | | |
|---|---|---|
| 4,858,141 A | 8/1989 | Hart et al. |
| 5,483,153 A | 1/1996 | Leeb et al. |
| 5,717,325 A | 2/1998 | Leeb et al. |
| 5,835,901 A | 11/1998 | Duvoisin, III et al. |
| 5,910,875 A | 6/1999 | Tian et al. |

(Continued)

FOREIGN PATENT DOCUMENTS

| | | |
|---|---|---|
| AU | 2012311097 A1 | 5/2013 |
| EP | 2026299 A1 | 2/2009 |

(Continued)

OTHER PUBLICATIONS

GE, "Wireless Lighting Control: Duplex Receptacle", Model 45605, May 15, 2009.*

(Continued)

*Primary Examiner* — Ryan Johnson
(74) *Attorney, Agent, or Firm* — Eckert Seamans; Philip E. Levy; Grant E. Coffield

(57) ABSTRACT

A load power device includes a power input, at least one power output for at least one load, a plurality of sensors structured to sense voltage and current at the at least one power output, and a processor. The processor provides: (a) load identification based upon the sensed voltage and current, and (b) load control and management based upon the load identification.

22 Claims, 7 Drawing Sheets

(56) References Cited

U.S. PATENT DOCUMENTS

| | | | |
|---|---|---|---|
| 6,081,123 A | 6/2000 | Kasbarian et al. | |
| 7,268,989 B2 | 9/2007 | Parker et al. | |
| 7,362,552 B2 | 4/2008 | Elms et al. | |
| 8,437,882 B2 * | 5/2013 | Craig | G06Q 10/00 700/22 |
| 8,756,181 B2 | 6/2014 | Lu et al. | |
| 2007/0086124 A1 | 4/2007 | Elms et al. | |
| 2009/0072985 A1 | 3/2009 | Patel et al. | |
| 2013/0066479 A1 | 3/2013 | Shetty et al. | |
| 2013/0138669 A1 | 5/2013 | Lu et al. | |

FOREIGN PATENT DOCUMENTS

| | | |
|---|---|---|
| EP | 2051379 B1 | 1/2011 |
| EP | 2389617 A1 | 11/2011 |
| GB | 2465367 A | 5/2010 |
| WO | 2008142173 A1 | 11/2008 |
| WO | 2010005985 A1 | 1/2010 |
| WO | 2011002735 A1 | 1/2011 |
| WO | 2011091444 A1 | 7/2011 |
| WO | 2013063786 A1 | 5/2013 |

* cited by examiner

LOAD POWER DEVICE, SYSTEM AND METHOD OF LOAD CONTROL AND MANAGEMENT EMPLOYING LOAD IDENTIFICATION

This invention was made with Government support under DE-EE0003911 awarded by the Department of Energy National Energy Technology Laboratory. The Government has certain rights in this invention.

BACKGROUND

Field

The disclosed concept pertains generally to electric loads and, more particularly, to load power devices that power such loads. The disclosed concept also pertains to systems and methods including load power devices.

Background Information

Power consumption monitoring and energy management of plug-in electric loads (PELs) inside buildings are often overlooked. By knowing the operating mode (e.g., operating status) of an electric load, energy savings can be achieved with effective management and control thereof. Also, operating mode and energy consumption of electric loads need to be communicated to building management systems in an automatic, low cost and non-intrusive manner.

Electric loads often present unique characteristics in outlet electric signals (i.e., voltage; current; power). Such load characteristics provide a viable mechanism to identify operating status (e.g., without limitation, active; standby) by analyzing the outlet electric signals.

Prior proposals include usage of wavelet coefficients obtained from wavelet transforms and event detection to detect switching of the load. Also, basic power quality related signatures (e.g., one or more of apparent power, cos(phi), active energy, reactive energy, frequency, period, RMS current, instantaneous current, RMS voltage, instantaneous voltage, current harmonic THD (total harmonic distortion) percentage, voltage harmonic THD percentage, spectral content of the current waveform, spectral content of the voltage waveform, spectral content of the active power waveform, spectral content of the reactive power waveform, quality of the network percentage, time, date, temperature, and humidity) are used as a signature to identify a load and its operating status.

For example, a load is in a standby mode when the current value obtained for each load current is less than a percentage of the maximum for each load current in the normal operating state. When an electric appliance plugged into a master socket consumes power less than a suitable threshold (e.g., that of standby power), then those peripheral sockets might be switched off automatically to cut further power consumption. While this may be true for some electric devices, other electric loads (e.g., without limitation, microwaves; refrigerators) have ON-OFF behavior which is a unique internal behavior of the electric load itself (e.g., a desktop computer low power mode). It is not user friendly if the "OFF" cycle of such a device is improperly considered to be a "standby" mode and such load is then turned OFF.

There is room for improvement in load power devices.

There is further room for improvement in systems and methods including load power devices.

SUMMARY

These needs and others are met by embodiments of the disclosed concept, which provides load identification based upon sensed voltage and current, and load control and management based upon the load identification.

In accordance with one aspect of the disclosed concept, a load power device comprises: a power input; at least one power output for at least one load; a plurality of sensors structured to sense voltage and current at the at least one power output; and a processor structured to provide: (a) load identification based upon the sensed voltage and current, and (b) load control and management based upon the load identification.

As another aspect of the disclosed concept, a method of providing load control and management based upon load identification comprises: employing a load power device comprising: a power input, at least one power output for at least one load, a plurality of sensors structured to sense voltage and current at the at least one power output, and a processor; providing load identification based upon the sensed voltage and current; and providing load control and management by the processor based upon the load identification.

As a further aspect of the disclosed concept, a system providing load control and management based upon load identification comprises: a plurality of load power devices, each of the load power devices comprising: a power input, at least one power output for at least one load, a plurality of sensors structured to sense voltage and current at the at least one power output, and a processor structured to provide: (a) load identification based upon the sensed voltage and current, and (b) load control and management based upon the load identification; and a remote energy management system remote from and in communication with the load power devices.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a controller; a microprocessor; a microcontroller; a microcomputer; a digital signal processor (DSP); a central processing unit; a mainframe computer; a mini-computer; a server; a networked processor; or any suitable processing device or apparatus.

As employed herein, the term "load power device" shall mean a power strip, a smart power strip, a receptacle, a smart receptacle, an outlet, a smart outlet, a plug, a single phase UPS, a power/energy meter, and a power/energy monitoring device at a circuit branch level.

The disclosed concept is described in association with example load power devices, loads and example load features, although the disclosed concept is applicable to a wide range of load power devices, and a wide range of loads and load features.

The disclosed concept can be employed by power strips, smart power strips, receptacles, plugs and outlets, power/energy meters, power/energy monitoring at a circuit branch level for building energy management, single phase UPSs, smart receptacle zonal networks, and building level load control for load shedding and demand response.

Figure 10:
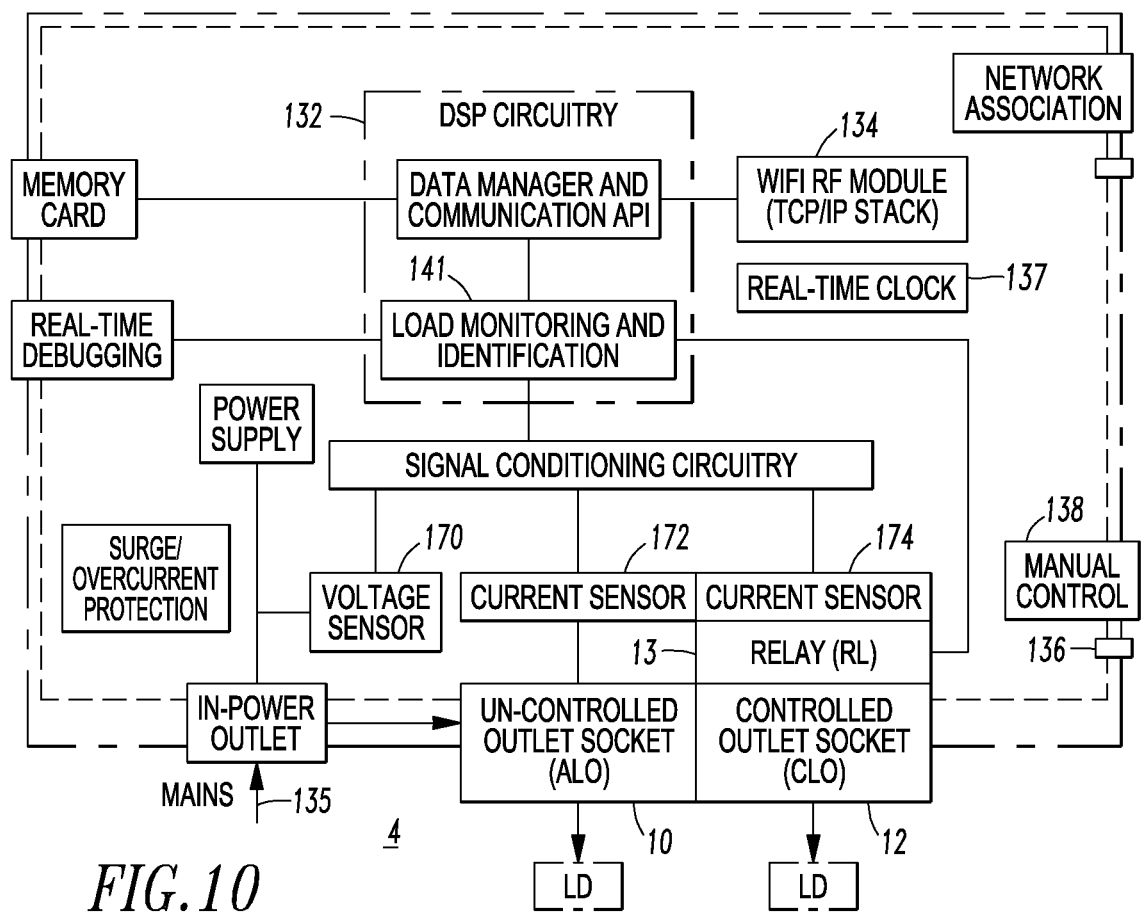
FIG. 10 is a functional block diagram of the SR of FIG. 1.

The disclosed concept provides load identification (ID) based load control and management in, for example and without limitation, an enhanced power strip/outlet device, such as a smart receptacle (SR) 4 (FIGS. 1 and 10) or an enhanced wiring-device (e.g., a smart wall-outlet). The SR 4 distributes power to downstream plugged-in devices similar to conventional power strips and receptacles, but with a pre-designated ALWAYS-ON-Load-Outlet (ALO) 10 and a Controllable-Load-Outlet (CLO) 12 as shown in FIG. 10. Uncontrolled load devices are plugged into the ALO 10, and controlled load devices are plugged into the CLO 12. The SR 4 preferably reports an energy or power consumption profile 16 (FIG. 11) for each outlet in real-time, and identifies device types including banned load devices which are prohibited based on a facility management policy.

Figure 11:
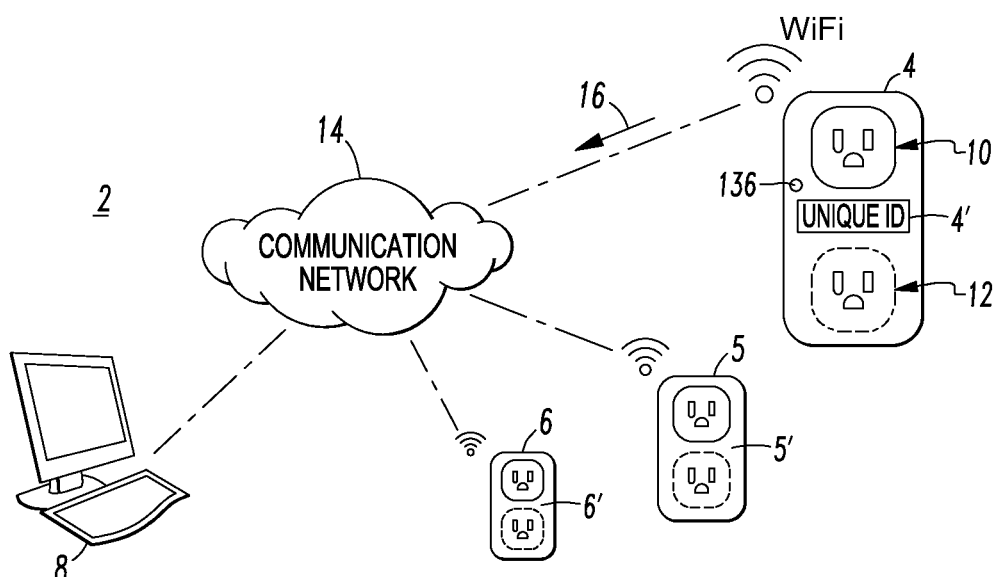
FIG. 11 is block diagram of a remote energy management system (REMS) including a plurality of SRs in accordance with an embodiment of the disclosed concept.

The multiple SRs within a zone (e.g., a user-selected zonal area that represents one specific use scenario) work collaboratively as a zonal SR-network. In the zonal SR-network, each SR, such as 4,5,6 of FIG. 11, is employed to identify the type and operating status of a number of plug-in load devices by using the electric waveforms at the power outlet level. An on-line learning mechanism is employed to recognize the contextual electric activities that can be adaptively tuned for individual use scenarios. Each SR 4,5,6 preferably also provides energy or power use monitoring and responses to ON/OFF control commands. The SRs can communicate with zonal SR analytics software (e.g., part of the remote energy management system (REMS) 8 shown in FIG. 11) located in a remote device (e.g., without limitation, a personal computer or a smart phone) over a communication network 14 such as the example WiFi network. The information from individual SRs fuse to the zonal SR analytics software. An artificial intelligence learning algorithm is employed to recognize users' behavioral patterns and provide occupancy estimation tailored to the specific use scenario. The users are also allowed to configure (e.g., customize) the load management and control policies (e.g., strategies) based their own specific scenarios. In the zonal communication network 14 of FIG. 11, each SR 4,5,6 has a unique ID 4',5',6' (e.g., a unique IP address) that can associate the corresponding workspace with a specific occupant for selecting management and control policies, as well as informing compliance. This permits the corresponding SR outlets 10,12 to be mapped to the user workspace.

It is believed that the combination of the disclosed load identification and sensorless occupancy estimation technologies, and the SR and zonal SR-network can lead to the next generation of intelligent power outlets—the very basic building modular-block of a flexible, high-efficient building-level management system.

Figure 1:
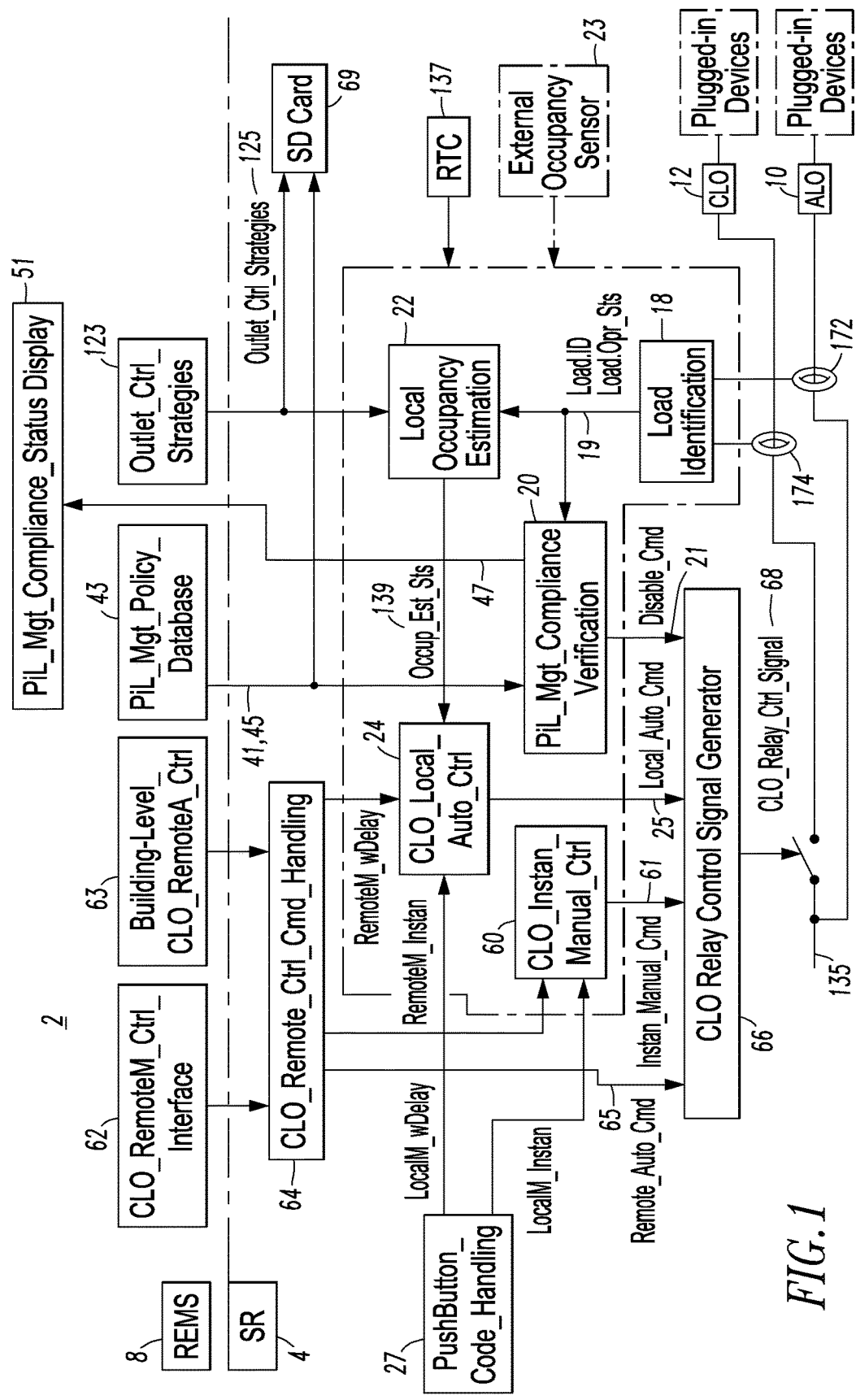
FIG. 1 is a block diagram of a system for load identification (ID) based control and management including a smart receptacle (SR) in accordance with embodiments of the disclosed concept.

Referring to FIG. 1, the system 2 for load identification (ID) based control and management is shown. Load ID information 19 (e.g., Load.ID and Load.Opr_Sts; ID and operating status) from load ID function 18 is the main input to the system 2 at the SR 4. The core functions of the system 2 include load management compliance verification 20, local occupancy estimation 22, and automatic control 24 for the controlled outlets, such as CLO 12 of FIG. 10.

Figure 2:
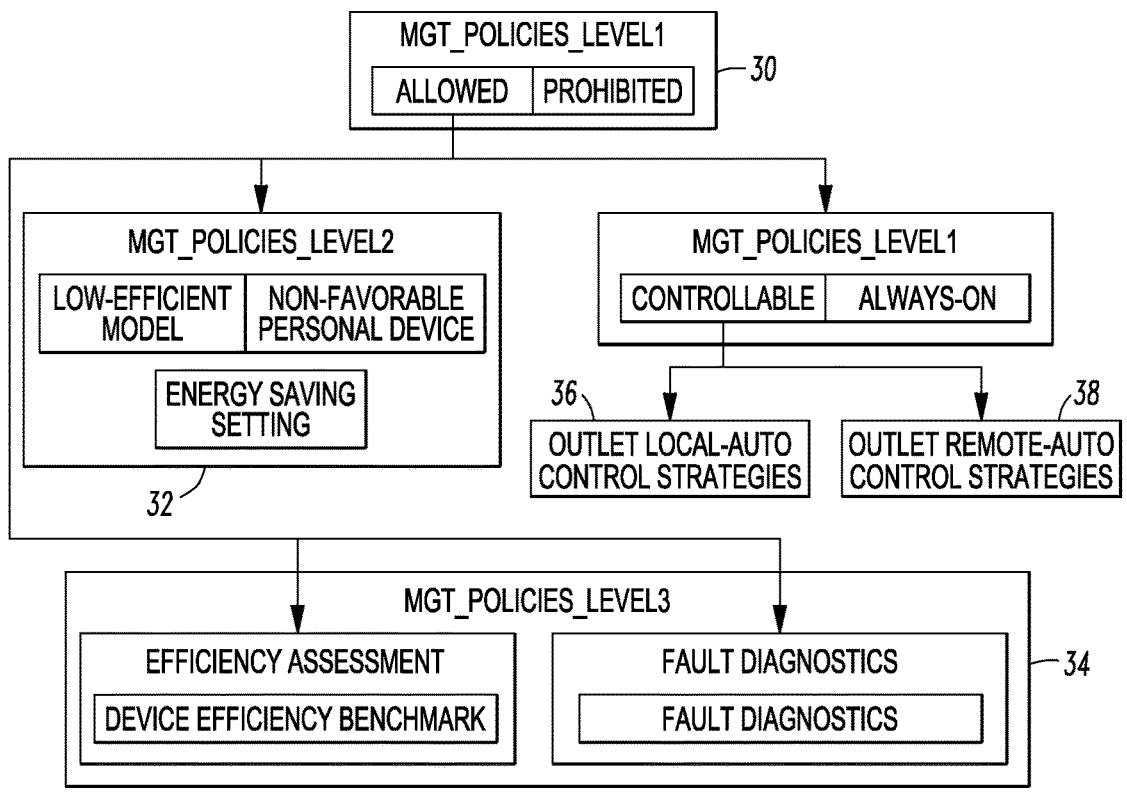
FIG. 2 is a block diagram of smart receptacle load control/management strategies/policies for the SR of FIG. 1.

FIG. 2 shows SR load control/management strategies/policies and provides a summary of how the policies and strategies are related with each other. Effective plug-in load (PiL) control and management in a building can be ensured by enforcing two sets of load management and control policies. First, building PiL management policies refer to the policies that facility managers use to regulate the use of PiLs in buildings, as well as to verify end-user compliance with the policies. These are grouped into three example levels: (1) Mgt_Policies_Level1 30; (2) Mgt_Policies_Level2 32; and (3) Mgt_Policies_Level3 34. Second, SR (relay) control strategies refer to the conditions of when to automatically turn-on/off the SR outlet relay(s) (e.g., relay (RL) 13 of FIG. 10). These can be based on both local and remote conditions: (1) outlet local-auto control strategies 36; and (2) outlet remote-auto control strategies 38.

Building PiL management policies (Mgt_Policies_Level1 30 and Mgt_Policies_Level2 32) support two main reasons why PiLs need to be managed in buildings: energy savings improvement and safety (e.g., without limitation, use of space heaters). Building PiL management policies are the building policies that facility managers choose to regulate the use of PiLs in buildings to address these issues. Table 1 gives a few examples of building PiL management policies along with their inherent violation conditions.

TABLE 1

| Level | Policy | Violation Conditions | Actionable Feedbacks | Applicable Load Examples |
|---|---|---|---|---|
| 1.1 | Keep critical loads always-ON | Critical loads are detected to plug into controllable-outlets | Flag warning-potential damage of devices; users are suggested to switch the load to an uncontrollable-outlet | PCs; networking devices |
| 1.2 | Ensure all controllable loads are properly controlled | Controllable loads are detected if plugged into uncontrollable-outlets | Flag warning-devices are not properly controlled; users are suggested to change the load to a controllable outlet | User assignment |

TABLE 1-continued

| Level | Policy | Violation Conditions | Actionable Feedbacks | Applicable Load Examples |
|---|---|---|---|---|
| 1.3 | Ban usage of certain load types | The use of prohibited loads is detected | Flag alarm-users are suggested to un-plug the particular plugged load; after a time-delay duration, the power will be deprived from the particular load (only applies to the controllable outlet) | User assignment |
| 2.1 | Reduce usage from low-efficiency loads | The use of a low-efficient load model is detected | Flag warning-users are suggested to replace the device with a high-efficient load model | Incandescent loads; CRT |
| 2.2 | Reduce some types of personal load usage | Non-suggested personal device usage is detected | Flag warning-users are suggested not to use personal loads, but to use shared devices in a public area | User assignment |
| 2.3 | Ensure loads go to energy saving mode | The plugged loads are detected if they never go to the low power mode | Flag warning-users are suggested to set up an energy saving mode for the particular device | Same as the critical |

How to enforce the compliance of these policies is always challenging to PiLs, such as plug-in appliances, since these appliances are normally distributed through a relatively large area. Auto-verification and feedback of the compliance status that can be centralized to facility managers helps to simplify the process. In order to verify whether the use of a PiL complies with building policies, the association between the loads (or load-types) and the policies is established. Each load, by either generic load types or customized load groups, is assigned/associated with one or multiple management-policies.

For implementation, this assignment/association is defined by a Load-Mgt-Policy-Association-Table. A default association table can be provided by the system. The association table can also be customized by the facility managers or users based on their own use scenarios.

Table 2 (Association_Table_Load_Mgt_Policies_Level1) provides examples of the association table for a set of example generic load types. Details on how the association table matches to association words are discussed, below.

Figure 3:
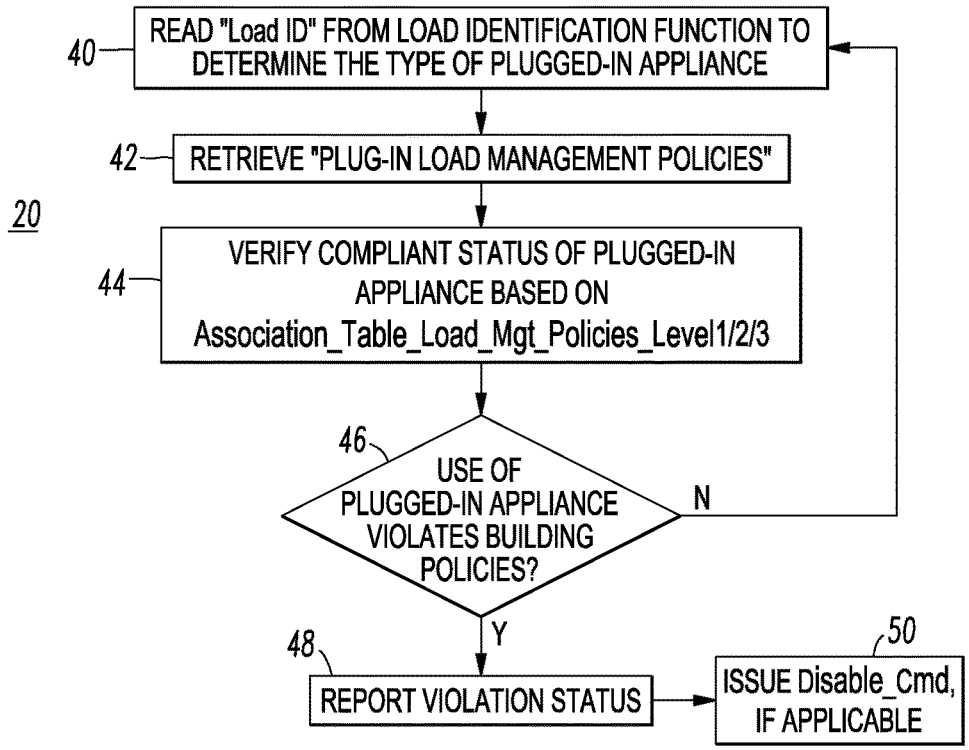
FIG. 3 is flowchart of a plug-in load (PiL) management compliance verification function for the SR of FIG. 1.

Each management policy has a pre-defined bit-position on the Association Word, as described in a MaskCode (e.g., 0x04 or bit 2 for critical loads, 0x02 or bit 1 for controllable loads, and 0x01 or bit 0 for prohibited loads). Each generic load type has three association words for the three example levels of management policies 30,32,34. The association words are compared with the corresponding MaskCodes to indicate the applicable policies to this device class. The auto-verification routine (PiL_Mgt_Compliance_Verification function 20 of FIGS. 1 and 3 is discussed below) checks the compliance status of the PiL device, i.e., whether the user is in compliance with the applicable policies that are associated with its device class.

Table 3 (Association_Table_Load_Mgt_Policies_Level2) and Table 4 (Association_Table_Load_Mgt_Policies_Level3) provide examples of the association tables for the example set of generic load types.

TABLE 2

| Generic Load Type | Critical | Controllable | Prohibited | Level1_Association Word |
|---|---|---|---|---|
| PC | + | | | 0x0004 |
| Monitor | | + | | 0x0002 |
| Refrigerator | | + | | 0x0002 |
| Space heater | | | + | 0x0001 |
| Incandescent lamp | | + | | 0x0002 |
| CRT | | + | | 0x0002 |
| Desk printer | | + | | 0x0002 |

TABLE 3

| Generic Load Type | Energy Savings | Non-Favorable | Low Efficient | Level2_Association Word |
|---|---|---|---|---|
| PC | + | | | 0x0004 |
| Monitor | | | | 0x0000 |
| Refrigerator | | + | | 0x0002 |
| Space heater | | | | 0x0000 |
| Incandescent lamp | | | + | 0x0001 |
| CRT | | | + | 0x0001 |
| Desk printer | + | + | | 0x0006 |

TABLE 4

| Generic Load Type | Spare | Fault Detection | Energy Star Evaluation | Level3_Association Word |
|---|---|---|---|---|
| PC | | | + | 0x0001 |
| Monitor | | | + | 0x0001 |
| Refrigerator | | + | | 0x0002 |
| Space heater | | | | 0x0000 |
| Incandescent lamp | | | | 0x0000 |
| CRT | | | | 0x0000 |
| Desk printer | | | | 0x0000 |

The applicable loads that are assigned to Mgt_Policies_Level1 30 are exclusive, i.e., one device class can be assigned to only one Mgt_Policy in Level1, and every device class is assigned by one of the level management policies. On the other hand, one load type can be assigned to multiple management policies in Level2 32. As a non-limiting example, as shown in Table 3, a desk printer can be assigned to two management policies in Level 2, e.g., energy savings and non-favorable. In this way, the building policy regulates that a desk printer is a non-suggested personal device, which is requested to go to energy savings mode when not in use.

The PiL_Mgt_Compliance_Verification function 20 (FIGS. 1 and 3) provides automatic verification of whether users comply with the PiL management policies. This provides messages that convey the compliance status 47 of the user of the PiL devices, as well as a Disable_Cmd 21 (FIG. 1) at 50 (FIG. 3) to control the CLO 12 (FIG. 10), if applicable. The inputs to the function 20 include: Outlet_Header (e.g., the outlet's ID, such as the SR's number (or unique IP address), and the outlet number (i.e., corresponding to CLO or ALO)); Load.ID+Load.Opr_Status 19 from the load ID function 18 at 40; PiL_Mgt_Policies 41 from the PiL_Mgt_Policy_Database 43 at 42; and PiL_Mgt_Policies_AssoTable 45 from the PiL_Mgt_Policy_Database 43 at 44, which verifies the compliant status of the PiL device based upon the three association tables 45. The outputs of the function 20 include: Compliance_Status 47 to a REMS PiL_Mgt_Compliance_Status display 51 (FIG. 1); and Disable_Cmd 21 to the CLO_Relay_Ctrl_Signal_Generator 66 at 50. As shown in FIG. 3, the function 20 obtains the identified current load type at 40, obtains and verifies the applicable management policies 41 at 42 and 44, goes through the compliance conditions at 46, as applicable, and reports the exceptions accordingly at 48. Loads are disabled, if applicable, at 50. For some load types, the existence of this type of load is a violation of the building policies. For other load types, how the load is used matters.

SR outlet (relay) control and strategies considers various outlet control ON/OFF conditions. One of the building PiL management policies is to ensure that all the controllable loads can be properly turned-ON/OFF based on the need of load use, with the minimum negative impact, and at the same time with maximized savings. The control, i.e., turning-ON/OFF, of the outlet relay (e.g., RL 13 of FIG. 10) is basically determined by the following (FIG. 1): (1) a user's manual control (local/remote) through the SR CLO_Instan_Manual_Ctrl function 60; (2) automatic detection of the user's occupancy by local automatic control through the local occupancy estimation function 22 and the CLO_Local_Auto_Ctrl function 24; (3) a higher level building decision, building load management policy related, to disable the CLO 12 through the management compliance verification function 20; and (4) a higher level building decision, building load shedding/demand response related, to provide remote automatic control through the REMS Building-Level_CLO_RemoteA_Ctrl function 63 and the SR CLO_Remote_Ctrl_Cmd_Handling function 64 (providing, e.g., RemoteM_Instan and RemoteM_wDelay; instantaneous and delayed remote manual control).

For implementation, the four outlet control signals 61,25, 21,65 from the above four sources are consolidated together by the CLO relay control signal generator function 66 (FIG. 1) to determine turning-ON/OFF the SR's CLO 12. The first signal is the Instant_Manual_Cmd signal 61 (either local manual turn-ON/OFF instantaneous (LocalM_Instan) from Pushbutton_Code_Handling 27 or remote manual turn-ON/OFF instantaneous (RemoteM_Instan) from the REMS CLO_RemoteM_Ctrl_Interface 62 via the SR CLO_Remote_Ctrl_Cmd_Handling function 64). The second signal is the Local_Auto_Cmd signal 25 (from the function 24 and derived from the local occupancy estimation function 22) considering Real-Time Scheduling, Remote Manual Turn-OFF with Timer-Delay, Local Manual Turn-OFF with Timer-Delay (local manual control does not support the delayed Turn-ON action), an optional external occupancy sensor 23 (shown in phantom line drawing), and load-sensing (for Master Devices, Power-Cycling-Sensitive Devices, and Power-Cycling-Insensitive Devices, which are defined based on how sensitive these devices are to power-cycling). The third signal is a Disable_Cmd 21 (the output of the PiL management compliance verification function 20; the disable command is only applied to the controllable outlet 12; for the always on outlet 10, only the alarm message is issued). The fourth signal is the building-level Remote_Auto_Cmd 65 remote automatic control signal, which considers demand response and load shedding. Any other automatic control signals are based on higher-level control decisions.

Figure 4:
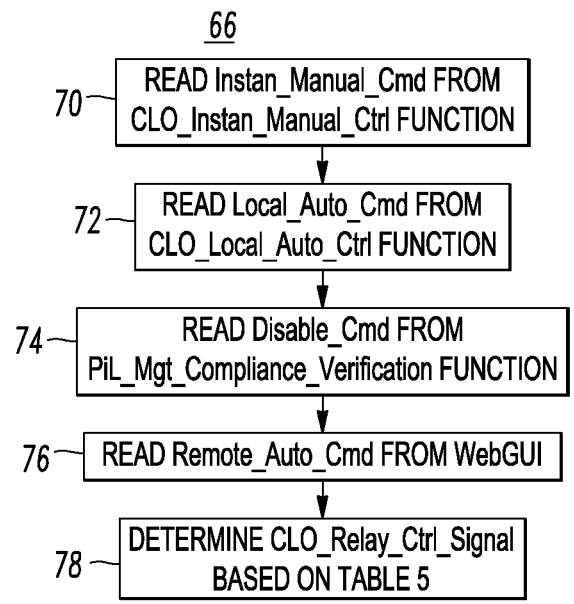
FIG. 4 is a flowchart of a Controllable-Load-Outlet (CLO) relay control signal generator function for the SR of FIG. 1.

The CLO relay control signal generator function 66 (FIGS. 1 and 4) generates the CLO_Relay_Ctrl_Signal 68 that is used to physically control the CLO relay 13 (FIG. 10). This function 66 is the last step of the CLO control logic, and the CLO_Relay_Ctrl_Signal 68 is transmitted from the DSP circuitry 132 (FIG. 10) to a microcontroller (not shown) which interfaces the REMS 8 and various local inputs (e.g., without limitation, the optional external occupancy sensor 23; the pushbutton 138 (FIG. 10); the real-time clock (RTC) 137 (FIGS. 1 and 10)) and outputs (e.g., without limitation, RL 13). The inputs of the function 66 of FIG. 4 include: (1) Instan_Manual_Cmd 61 from the CLO_Instan_Manual_Ctrl function 60 (FIG. 1) at 70; (2) Local_Auto_Cmd 25 from the CLO_Local_Auto_Ctrl function 24 (FIG. 1) at 72; (3) Disable_Cmd 21 from the PiL_Mgt_Compliance_Verification function 20 (FIG. 1) at 74; and (4) Remote_Auto_Cmd 65 from the CLO_Remote_Ctrl_Cmd_Handling function 64 (FIG. 1) at 76. The output at 78 is the CLO_Relay_Ctrl_Signal 68. Table 5 shows the four groups of control priority among local-automatic control, remote-automatic control, manual control and disable command control, and how they interact with each other to generate the final relay control signal 68.

TABLE 5

| Relay Control Signal (Output) | Local_Auto_Cmd | Remote_Auto_Cmd | Instan_Manual_Cmd | Disable_Cmd |
|---|---|---|---|---|
| 0 | X | X | X | 0 |
| 1 | X | X | ↑ | 1 |
| 0 | X | X | ↓ | 1 |
| 0 | X | ↓ | X | 1 |
| 0 | 0 | ↑ | X | 1 |
| 1 | 1 | ↑ | X | 1 |
| 1 | ↑ | 1 | X | 1 |
| 0 | ↑ | 0 | X | 1 |
| 0 | ↓ | X | X | 1 |

In Table 5, column 1, Open (Relay) = OFF (Load) = 0 (Control signal), and Close (Relay) = ON (Load) = 1 (Control signal). Also, "↑" is a 0 to 1 transition, and "↓" is a 1 to 0 transition.

Figure 5:
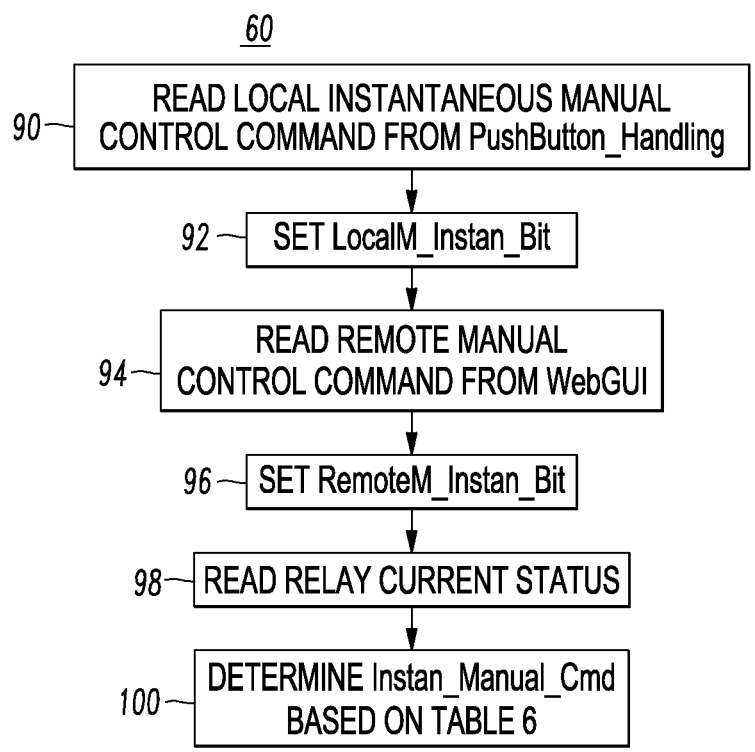
FIG. 5 is a flowchart of a CLO instantaneous manual control function for the SR of FIG. 1.

The CLO_Instan_Manual_Ctrl function 60 (FIGS. 1 and 5) handles the logic between the two remote and local instantaneous manual control commands (RemoteM_Instan and LocalM_Instan), and generates the CLO instantaneous manual control command 61. The inputs of the function 60 include: (1) an enable word for a LocalM_Instan_Bit from the pushbutton handling function 80 (FIG. 9) at 90 (FIG. 5); (2) the LocalM_Instan_Bit at 90 (FIG. 5) from the pushbutton handling function 80 (FIG. 9) at 90; (3) an enable word for a RemoteM_Instan_Bit from the CLO_Remote_Ctrl_Cmd_Handling function 64 (FIG. 1) at 94; (4) the RemoteM_Instan_Bit from the function 64 (FIG. 1) at 94; and (5) CLO relay status of the RL 13 (FIG. 10). The output of the function 60 is the Instan_Manual_Cmd 61 to the CLO relay control signal generator 66 (FIG. 1). The two instantaneous manual control commands complement each other and set corresponding bits at 92 and 96, and a toggle mechanism is used to manually turn-ON/OFF the outlet relay 13 at 100. Table 6 shows how the Instan_Manual_Cmd command 61 is generated.

TABLE 6

| Instan_Manual_Cmd | Relay Current Status | RemoteM_Instan_Bit | LocalM_Instan_Bit |
|---|---|---|---|
| 1 | 0 | Pulse | X |
| 1 | 0 | X | Pulse |
| 0 | 1 | Pulse | X |
| 0 | 1 | X | Pulse |

The generation of Remote_Auto_Cmd signal 65, Instan_Manual_Cmd signal 61 and Disable_Cmd 21 are easily derived by persons of ordinary skill in the art. The following discusses the logic for the CLO local auto control function 24.

The local occupancy estimation function 22 (FIGS. 1 and 7) estimates the occupancy status of the user based on the information available to SR 4 (with or without the optional external occupancy sensor 23). This approach can also be called sensorless-occupancy estimation. Occupancy estimation addresses the local automatic control of the CLO 12 (FIG. 10) with minimal negative impact to users. The inputs of the function 22 include: (1) real time as synchronized from the microcontroller real-time clock 137 (FIGS. 1 and 10); (2) external occupancy sensor status from the optional occupancy sensor 23; (3) Last_Manual_ON_RealTime from the CLO_Instan_Manual_Ctrl function 60 (FIG. 1); (4) Load.ID+Load.Opr_Sts 19 from the load identification function 18 (FIG. 1); and (5) Outlet_Ctrl_Strategies 125 from the REMS Outlet_Ctrl_Strategies function 123. The outputs of the function 22 include: (1) Occup_Est_Sts 139 status to the CLO_Local_Auto_Ctrl function 24 (FIG. 1); and (2) Auto_PRE_OFF_Timer (not shown) to the CLO_Local_Auto_Ctrl function 24 (FIG. 1).

Figure 7:
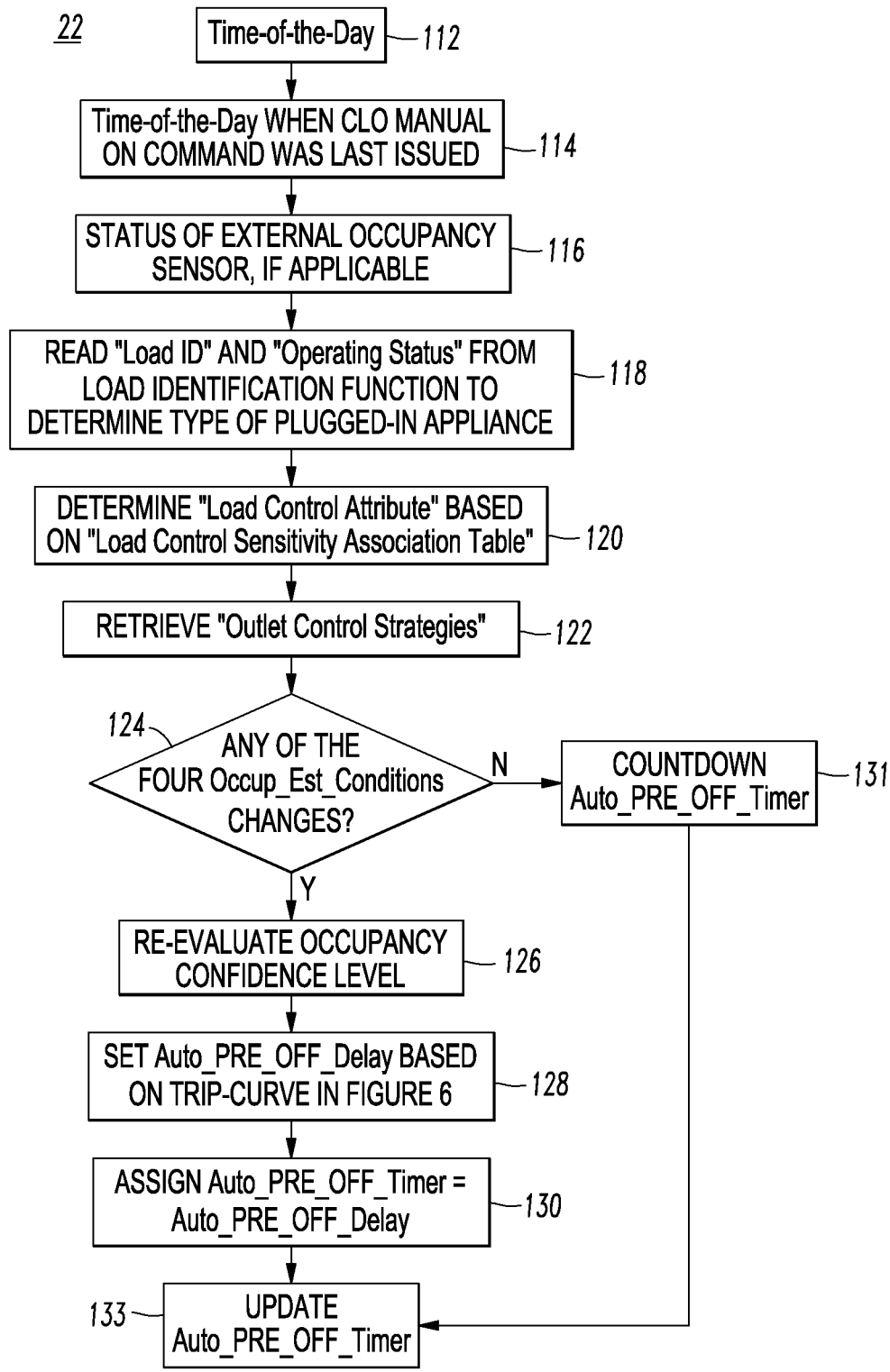
FIG. 7 is a flowchart of a local occupancy estimation function for the SR of FIG. 1.

The function 22 estimates the occupancy (or absence) status of the user, i.e., Occup_Est_Sts 139 with Absent_Conf_Level, determines the right moment to turn-ON/OFF the CLO 12, i.e., Auto_PRE_OFF_Timer based on the Occup_Est_Sts 139, and allows the user to customize the applicable conditions, i.e., Outlet_Ctrl_Strategies 125 to evaluate the Occup_Est_Sts 139. The following conditions are the Occup_Est_Conditions for evaluating the user's occupancy/absence confidence level: (1) real-time scheduling (RTS) at 112 (FIG. 7); (2) Manual Turn-ON (MTO) (e.g., the first several hours after the CLO 12 is turned-ON show strong evidence of the user's occupancy) at 114; (3) optional occupancy sensor 23 at 116; and (4) Plugged-in Loads Sensing (PiLS) for Master-Device Operating Mode (MSO); Power-Cycling-Sensitive Operating Mode (PSO); and Power-Cycling-Insensitive Operating Mode (PISO); these include the load ID and the operating status 19 from the load identification function 18 (FIG. 1) at 118.

At 120, a Load Control Attribute is determined based on a Load Control Sensitivity Association Table (Table 11). Then, at 122, the outlet control strategies 125 (FIG. 1) are retrieved from the REMS 8.

Figure 6:
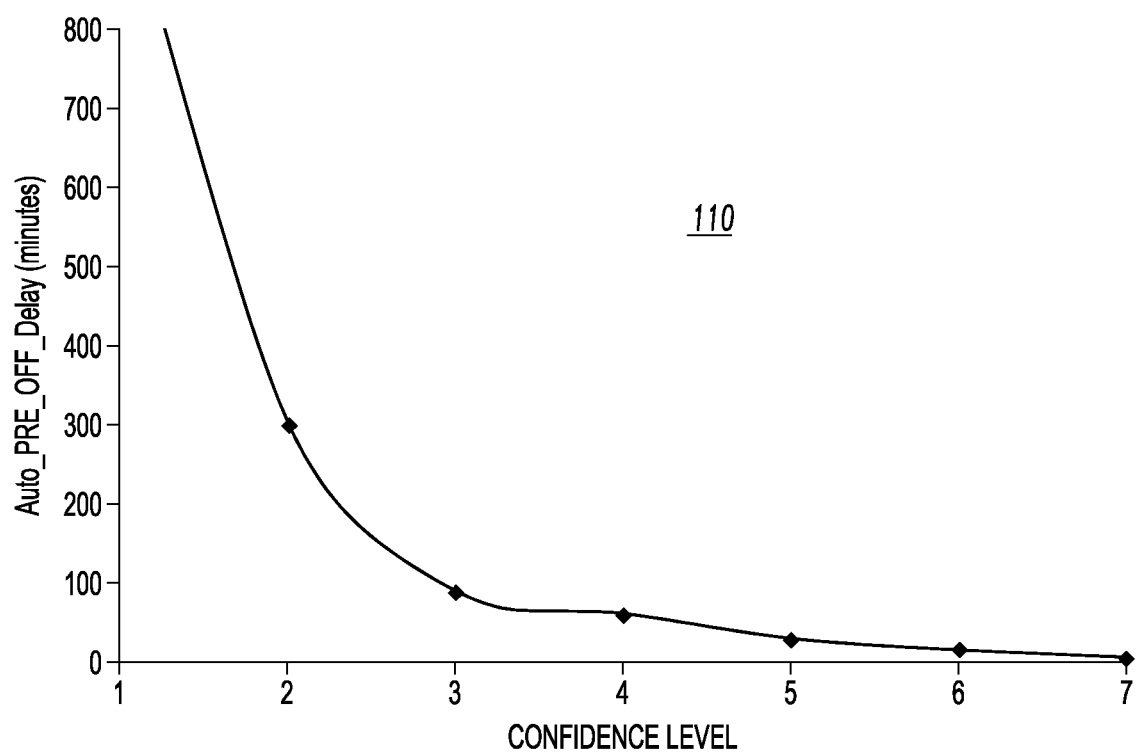
FIG. 6 is a plot of an automatic pre-OFF delay versus the confidence level of a user's absence for the SR of FIG. 1.

If any of the four example Occup_Est_Conditions changes at 124, then the function 22 sets New_Occup_Sts_Detected=ONE; starts evaluating the occupancy (or user's absence) confidence level at 126; assigns the corresponding Auto_PRE_OFF_Delay based on the trip-curve 110 of FIG. 6 at 128; and updates Auto_PRE_OFF_Timer=Auto_PRE_OFF_Delay at 130. Otherwise, if there is no change in the Occup_Est_Conditions at 124, and if Auto_PRE_OFF_Timer>0, then countdown Auto_PRE_OFF_Timer=Auto_PRE_OFF_Timer−1 at 131. Finally, after 130 or 131, the Auto_PRE_OFF_Timer is updated at 133.

FIG. 6 plots Auto_PRE_OFF_Delay (minutes) versus the confidence level of the user's absence. Table 7 shows one example of assigning Occup_Est_Sts and Absent_Conf_Level based on different scenarios of Occup_Est_Conditions. The assignment for Absent_Conf_Level and Auto_PRE_OFF_Delay can be customized/configured by users based on their own use scenarios.

Table 8 shows the occupancy detection logic and describes the interaction between the two MOFF_wDelay conditions and the effect on the M_PRE_OFF_Delay.

TABLE 7

| I/O | Signal | | | | | | | |
|---|---|---|---|---|---|---|---|---|
| O | Auto_PRE_OFF_Delay | −1 | 5 Hours | 4 Hours | 3 Hours | 2 Hours | 1 Hour | 0 |
| O | Absent_Conf_Level | 1 | 2 | 3 | 4 | 5 | 6 | 7 |
| O | Occup_Est_Sts | Occupied | Absent? | Absent? | Absent? | Absent? | Absent? | Absent |
| O | Local_Auto_Ctrl Action | Turn-ON | Turn-ON | Turn-ON | Turn-ON | Turn-ON | Turn-ON | Turn-OFF |
| I | Real-Time Scheduling | X | 1 | 1 | 0 | 0 | 1 | 0 |
| I | Manual Turn-ON | | | | | | | |
| I | Occupancy Sensor | X | X | 1 | 1 | X | 0 | 0 |
| I | Pwr-Insensitive Device O-Status | X | 1 | 0 | 0 | 1 | 0 | 0 |
| I | Master/Pwr-Sensitive Device O-Status | 1 | 0 | 0 | 0 | 0 | 0 | 0 |

TABLE 8

| | Inputs | | | Outputs | |
|---|---|---|---|---|---|
| I/O | LocalMOFF_wDelay_Enabled | RemoteMOFF_wDelay_Enabled | MOFF_wDelay_Enabled | M_PRE_OFF_Delay | M_PRE_OFF_Timer |
| O | 0 | ↑ | ↑ | M_PRE_OFF_Delay = RemoteM_PRE_OFF_Delay | M_PRE_OFF_Timer = M_PRE_OFF_Delay; RemoteM_PRE_OFF_Delay = 0 |
| O | 1 | ↑ | ↑ | | |

TABLE 8-continued

| | Inputs | | | Outputs | |
|---|---|---|---|---|---|
| I/O | LocalMOFF_ wDelay_Enabled | RemoteMOFF_ wDelay_Enabled | MOFF_ wDelay_Enabled | M_PRE_OFF_Delay | M_PRE_OFF_Timer |
| O | ↑ | 0 | ↑ | M_PRE_OFF_Delay = LocalM_PRE_OFF_Delay | M_PRE_OFF_Timer = M_PRE_OFF_Delay; |
| I | ↑ | 1 | ↑ | M_PRE_OFF_Delay = LocalM_PRE_OFF_Delay + M_PRE_OFF_Timer | LocalM_PRE_OFF_Delay = 0 |
| I | 0 | 0 | 0 | 0 | 0 |
| I | 1 | 1 | 1 | | M_PRE_OFF_Timer counts down |
| I | 1 | 0 | 1 | | |
| I | 0 | 1 | 1 | | |

Figure 8:
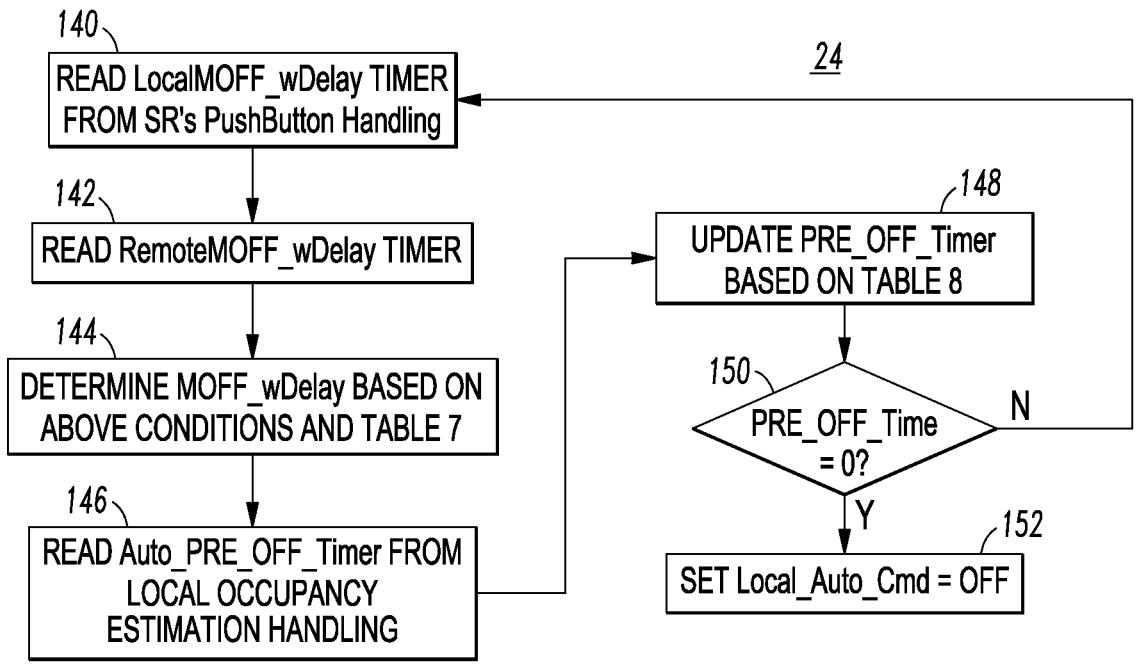
FIG. 8 is a flowchart of a local automatic CLO control function for the SR of FIG. 1.

The CLO_Local_Auto_Ctrl function 24 (FIGS. 1 and 8) handles the logic between the conditions that will trigger the automatic turn-ON/OFF of the CLO 12 (FIG. 10). The inputs of the function 24 include: (1) LocalMOFF_wDelay+ LocalM_PRE_OFF_Delay (LocalM_wDelay) from the PushButton_Code_Handling function 27 (FIG. 1) at 140; (2) RemoteMOFF_wDelay+RemoteM_PRE_OFF_Delay (RemoteM_wDelay) from the CLO_Remote_Ctrl_Cmd_Handling function 64 (FIG. 1) at 142 (e.g., from the REMS 8 via a web GUI); and (3) Occup_Est_Sts 139+Auto_PRE_ OFF_Timer from the local occupancy estimation function 22 (FIG. 1) at 146. The outputs of the function 24 include: (1) Local_Auto_Cmd 25 to the CLO relay control signal generator function 66 (FIG. 1) at 152; and (2) a LocalM_PRE_OFF_Delay (global). The function 24 uses three automatic control conditions, two of which are issued with a user's interference (MOFF_wDelay_Conditions) at 144: (1) local manual turn-OFF control with time-delay (LocalMOFF_wDelay: issued in response to the SR's pushbutton 138 (FIG. 10)); and (2) remote manual turn-OFF control with time-delay (RemoteMOFF_wDelay: triggered from a web GUI of the REMS 8 (FIGS. 1 and 10)). The third automatic control condition is generated through the local occupancy estimation function 22 (FIG. 1) (Occup_ Est_Conditions) using local automatic turn-ON/OFF control with time-delay.

Table 9 shows the logic that describes the interaction between the consolidated MOFF_wDelay_Conditions and the Occup_Est_Conditions, the effect on PRE_OFF_Timer, and other actions.

TABLE 9

| | Outputs | |
|---|---|---|
| Scenarios | PRE_OFF_Timer | Other Actions |
| Occupied ↑ | PRE_OFF_Timer = −1 (Infinite) | Local_Auto_Cmd = ON, New_Occup_Sts_ Detected = ZERO |
| Absent<7 ↑ | PRE_OFF_Timer = A_PRE_OFF_Timer | Local_Auto_Cmd = ON, New_Occup_Sts_ Detected = ZERO |
| Absent>7 ↑ | PRE_OFF_Timer = 0 | Local_Auto_Cmd = OFF, New_Occup_Sts_ Detected = ZERO |
| Occupied ↑ + MOFF_wDelay_ Enabled | PRE_OFF_Timer = −1 (Infinite) | Local_Auto_Cmd = ON, New_Occup_Sts_ Detected = ZERO |
| Absent<7 ↑ + MOFF_wDelay_ Enabled | PRE_OFF_Timer = max (A_PRE_OFF_Timer, M_PRE_OFF_Timer) | Local_Auto_Cmd = ON, New_Occup_Sts_ Detected = ZERO |
| Absent>7 ↑ + MOFF_wDelay_ Enabled | PRE_OFF_Timer = 0 | Local_Auto_Cmd = OFF, New_Occup_Sts_ Detected = ZERO |

TABLE 9-continued

| | Outputs | |
|---|---|---|
| Scenarios | PRE_OFF_Timer | Other Actions |
| Occupied + MOFF_wDelay_ Enabled ↑ | PRE_OFF_Timer = M_PRE_OFF_Delay | |
| Absent<7 + MOFF_wDelay_ Enabled ↑ | PRE_OFF_Timer = max (A_PRE_OFF_Timer, M_PRE_OFF_Delay) | |
| Absent>7 + MOFF_wDelay_ Enabled ↑ | N/A or PRE_OFF_Delay = M_PRE_OFF_Delay | N/A |

When the PRE_OFF_Timer counts down to zero at 150, the function 24 sets Local_Auto_Cmd=OFF at 152, resets MOFF_wDelay_Enabled to zero, and resets LocalMOFF_ wDelay_Enabled or RemoteMOFF_wDelay_Enabled to zero, whichever is applicable.

Figure 9:
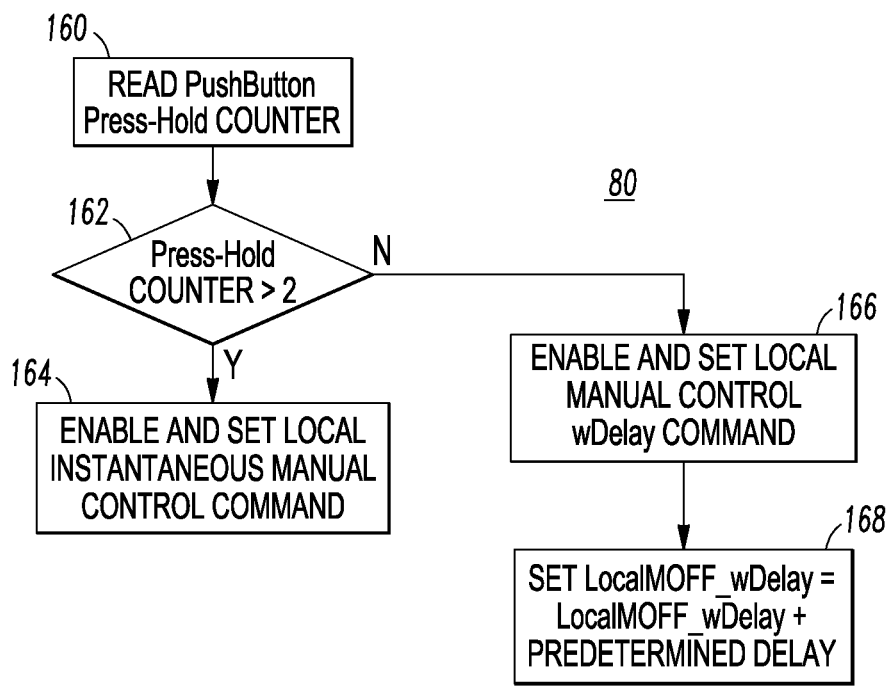
FIG. 9 is a flowchart of an SR pushbutton handling function for the SR of FIG. 1.

The PushButton_Code_Handling (DSP side) function 80 (FIG. 9) interoperates with the PushButton_Code sent from microcontroller function 27 (FIG. 1) at 160 for various CLO control commands (e.g., LocalM_wDelay; LocalM_Instan), and updates the CLO_Ctrl_Word accordingly. The inputs of the function 80 include: (1) PushButton_Code from the microcontroller function 27 at 160; (2) CLO_Relay_Status from the microcontroller routine (not shown); and (3) LocalM_PRE_OFF_Delay (global) from the CLO_ Local_Auto_Ctrl function 24 (FIG. 1). The outputs of the function 80 include: (1) an enable word for the CLO LocalM_Ctrl_Instan_Bit; (2) the CLO LocalM_Ctrl_ Instan_Bit; (3) an enable word for the CLO LocalMOFF_wDelay_Bit; (4) the CLO LocalMOFF_wDelay_Bit; and (5) the CLO TimeDelay.LocalMOFF_wDelay. Table 10 shows the logic of the function 80 and FIG. 9 shows the flowchart.

The load ID algorithm real-time implementation hardware platform for the SR 4 integrates the embedded load ID, PiL control and management strategies, Wi-Fi communication, and a web-service-based user interface. As shown in FIG. 10, the SR 4 includes V/I sensing/signal sensing and conditioning at the outlet level, DSP circuitry 132, and a Wi-Fi RF module 134 (e.g., IEEE 802.11.a/b/g). The DSP circuitry 132 provides for embedded, nonintrusive detection of load types and operating mode identification 141. A voltage sensor 170 senses voltage at the power outlets 10,12 from the mains power input 135. Two current sensors 172,174 sense current flowing to the respective power outlets 10,12. As shown in FIGS. 1 and 10, there is a current sensor 174 on the CLO 12 and a current sensor 172 on the ALO 10. This enables the system 2 to identify and alert if a load should not be allowed on either or both of the CLO 12 and the ALO 10.

The distribution of power to downstream PiL devices is similar to conventional power strips or receptacles, but with the pre-designated ALWAYS-ON-Load-Outlet (ALO) 10 and the Controllable-Load-Outlet (CLO) 12 with relay/switch circuitry (e.g., 120 V @ 60 Hz; 230V @ 50 Hz) for the output control relay 13. A color coded light emitting diode (LED) 136 indicates CLO status and load compliance status. A mini-SD card 69 (FIG. 1) supports data logging, web page scripts, and load control/management policies. Web services support remote access of the SR 4. A pushbutton 138 provides support for CLO control manual override and OFF delay extension. The user interface of the REMS 8 (FIG. 1) includes a real-time load use status display, remote control of CLOs 12 (FIG. 1), and a PiLMC (Plug-in Load Management and Control) configuration.

TABLE 10

| PushButton Motion | PushButton Code | CLO_Ctrl_Cmd Updates |
|---|---|---|
| Press-Hold of the PushButton >2 seconds | LocalM_Ctrl_Instan | CLO_Ctrl_Cmd.Enable_Word.LocalM_Instan_Bit = 1; CLO_Ctrl_Cmd.Cmd_Word.LocalM_Instan_Bit = 1 |
| Press-Hold of the PushButton <1 seconds | LocalMOFF_wDelay | If CLO_Relay_Status = 1, then if CLO_Ctrl_Cmd.Enable_Word.LocalMOFF_wDelay_Bit = 0 and CLO_Ctrl_Cmd.Cmd_Word.LocalMOFF_wDelay_Bit = 0, then CLO_Ctrl_Cmd.Enable_Word.LocalMOFF_wDelay_Bit = 1; CLO_Ctrl_Cmd.Cmd_Word.LocalMOFF_wDelay_Bit = 1; CLO_Ctrl_Cmd.Ctrl_TimeDelay.LocalMOFF_Delay = CLO_Ctrl_Cmd.Ctrl_TimeDelay.LocalMOFF_Delay + 30 minutes |

Generally, if the press-hold duration of the SR pushbutton 138 (FIG. 10) is longer than 2 seconds at 162 of FIG. 9, then it is interpreted as an instantaneous manual turn-ON/OFF control, and the command is for an ON or OFF action depending on the current status of the CLO 12 at 164. Otherwise, if the press-hold duration of the pushbutton 138 is less than 1 second, then it is interpreted as a manual turn-OFF control with time-delay at 166, and one press-hold (<1 second) extends the SR_PRE_OFF_Timer for a predetermined delay (e.g., without limitation, one-half hour) at 168.

The Outlet_Ctrl_Strategies 125 are the conditions needed by the local occupancy estimation function 22 (FIGS. 1 and 7). This function 22 updates local SR outlet control strategies based on the strategies sent from microcontroller (not shown). The inputs are the Outlet_Ctrl_Strategies 125 from the REMS 8 or the SD card 69 by the microcontroller routine (not shown) and the outputs are the Outlet_Ctrl_Strategies. Two specific fields are needed by the function 22: (1) Outlet Local Control ON/OFF Conditions Assignment—these are conveyed in the Outlet_Local_Ctrl_Strategies (users can save up to eight customized control strategies, which can be provided through the SD card 69 (FIG. 1), and can also be customized by a user through the web GUI); and (2) Load Control Sensitivity Association Table (Table 11) which is used to define how sensitive the generic device classes are to the power-cycling and user's occupancy. Table 11 shows the Control_Strategies to ON/OFF_Conditions Association and the Ctrl_ONConditions_AssoTable

TABLE 11

| Generic Device Class | Master | Power-Cycling Sensitive | Power-Cycling Insensitive | Load_CtrlSensitivity_Association Word |
|---|---|---|---|---|
| PC | + | + | | 0x0006 |
| Monitor | | + | | 0x0002 |
| Refrigerator | | | | 0x0000 |
| Space heater | | | + | 0x0001 |
| Incandescent lamp | | | + | 0x0001 |
| CRT | | + | | 0x0002 |

In the example Association Word of Table 11, Power-Cycling Insensitive is 0x0001 (bit 0), Power-Cycling Sensitive is 0x0002 (bit 1), and Master is 0x0004 (bit 2). These bits can be ORd together (e.g., as shown with PC=0x0006).

For user interaction for PiL control and management, webpages are preferably employed to facilitate the customization of load management/control policies and strategies by users. For building-level PiL management policies configuration, the user can fill in a table similar to Tables 2-4. The resultant information is the Struct Mgt_Policies_AssoTable_Strct and the Generic_Mgt_Policy_AssoTable [25], which includes, for example, 25 generic device classes. For the outlet control strategies configuration, the user provides two pieces of information. First, a simple questionnaire helps determine the user's behavior and the intended use of SRs (e.g., sample questions could be: Do you hold a regular working-hour schedule?; What is your normal working-hour schedule?; Do you use an occupancy sensor for the SRs?; Do you want to use the ALO-Device as a Master-Device to control CLO-Devices?). Second, the answers to the above questions help set up the Outlet Local Control ON/OFF Conditions and assignment of the significant level of each condition. The resultant information is the Struct Outlet_Ctrl_Strategy Outlet_Local_Ctrl_Strategies. This information forms the base for the occupancy status estimation, and consequently the reliable automatic control decisions for controlled outlets. The resultant information is the Struct Load_CtrlSensitivity_AssoTable_Strct.

The disclosed concept allows users and facility energy managers to have contextual visibility to actual users' occupancy activities and behavioral patterns, thus obtaining a better understanding of the minimum energy service demand and where energy is wasted. This contextual information enables further energy efficient actions for more energy saving potentials.

The disclosed concept can provide not only direct energy savings, but also improvements of use and users' acceptance. The later factors are essential to enable true adoption and compliance of PiL control and management solutions, and consequently enable/improve the actual energy savings from PiL power consumption.

It is believed that the disclosed concept can provide greater than a 10% reduction in plug-level energy consumption. The disclosed SR 4 with integrated load ID are able to obtain improved energy savings through automatic control of the CLO 12. This improves visibility with actionable information and further saving opportunities identified, reduces negative impact due to potential (perceived) interruption of work flow through an estimated 10% reduction of nuisance tripping of the SR's CLO control compared to known advanced power strip (APS) control solutions, reduces installation cost by reducing the time spent on initial setup and configuration by at least one-half, with the reduction rate increasing further with a larger scale of system deployment, and reduces ongoing maintenance (re-commissioning) costs due to improved compliance.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A load power device comprising:
   a power input;
   at least one power output for at least one load;
   a plurality of sensors structured to sense voltage and current at said at least one power output; and
   a processor structured to provide: (a) load identification based upon said sensed voltage and current, and (b) load control and management based upon the load identification,
   wherein said at least one power output for the at least one load includes one or more power outlets, and
   wherein the load control and management includes load management compliance verification, local occupancy estimation and automatic control of at least one of the one or more power outlets.

2. The load power device of claim 1 wherein the one or more power outlets includes a first power outlet and a second power outlet; and wherein the first power outlet is always on for an uncontrolled load device and the second power outlet is controllable by said processor for a controlled load device.

3. The load power device of claim 1 wherein said processor is further structured to provide in real-time an energy or power consumption profile for each of said at least one power output.

4. The load power device of claim 1 wherein said processor is further structured to identify a load device type or a banned load device powered by one of said at least one power outlet.

5. A method of providing load control and management based upon load identification, said method comprising:
   employing a load power device comprising: a power input, at least one power output for at least one load, a plurality of sensors structured to sense voltage and current at said at least one power output, and a processor;
   providing load identification based upon said sensed voltage and current;
   providing load control and management by said processor based upon the load identification;
   providing a device including an on-line learning mechanism to recognize contextual electric activities that can be adaptively tuned for individual use scenarios;
   communicating between the load power devices and the device including the on-line learning mechanism; and
   recognizing a user's behavioral pattern and providing occupancy estimation based upon different use scenarios.

6. The method of claim 5 wherein the device is a remote device remote from said load power devices.

7. The method of claim 5 further comprising enabling configuration of load management and control policies.

8. The method of claim 5 further comprising providing sensorless occupancy estimation.

9. The method of claim 5 further comprising:
   detecting activation of a pushbutton of one of said load power devices of greater than a first predetermined time and responsively changing an on or off state of one of the at least one power output; and
   detecting activation of said pushbutton of smaller than a smaller second predetermined time and responsively turning off said one of the at least one power output after a third predetermined time.

10. A system providing load control and management based upon load identification, said system comprising:
    a plurality of load power devices, each of said load power devices comprising:
      a power input,
      at least one power output for at least one load,
      a plurality of sensors structured to sense voltage and current at said at least one power output, and
      a processor structured to provide: (a) load identification based upon said sensed voltage and current, and (b) load control and management based upon the load identification; and
    a remote energy management system remote from and in communication with said load power devices,
    wherein the load control and management is based upon a first set of load control policies and a second set of load management policies,
    wherein the first set includes outlet local automatic control strategies and outlet remote automatic control strategies, and
    wherein the second set includes a plurality of load management policies to regulate use of loads in buildings and verify user compliance with the load management policies.

11. The system of claim 10 wherein the load management policies include a plurality of levels each of which associates a plurality of loads or load types with the load management policies.

12. The system of claim 11 wherein a load management policy association table defines the association of the loads or the load types with the load management policies.

13. The system of claim 11 wherein the levels include at least a first level and a second level; wherein one of a plurality of load device classes is assigned to only one of the load management policies in the first level; and wherein each of the load device classes is assigned by one of the load management policies in the first level.

14. The system of claim 13 wherein one of the load types is assigned to a plurality of the load management policies in the second level.

15. The system of claim 10 wherein said processor includes a management compliance verification function structured to provide automatic verification of user compliance with the load management policies.

16. The system of claim 15 wherein one of said at least one power outlet is controllable by said processor for a controlled load device; wherein said processor is further structured to output a user compliance status of the user compliance and of the controlled load device and a disable command to control said one of said at least one power outlet.

17. The system of claim 10 wherein the load control policies include: (1) local or remote manual control; (2) local automatic control based on a user's occupancy; and (3) remote automatic control.

18. The system of claim 17 wherein the remote automatic control is responsive to at least one of a building load management policy and building load shedding/demand response considerations.

19. The system of claim 17 wherein the user's occupancy is determined based upon at least one of: (1) real-time scheduling; (2) manual turn-ON of one of the at least one power output; (3) a user occupancy sensor; and (4) load sensing for a master-device operating mode, a power-cycling-sensitive operating mode and a power-cycling-insensitive operating mode.

20. The system of claim 17 wherein the local automatic control provides an automatic turn-OFF of one of the at least one power output as a function of a confidence level of a user's absence.

21. The system of claim 10 wherein said remote energy management system enables configuration of the load control and management from a webpage that configures a plurality of load management and control policies.

22. A system providing load control and management based upon load identification, said system comprising:
  a plurality of load power devices, each of said load power devices comprising:
    a power input,
    at least one power output for at least one load,
    a plurality of sensors structured to sense voltage and current at said at least one power output, and
    a processor structured to provide: (a) load identification based upon said sensed voltage and current, and (b) load control and management based upon the load identification; and
  a remote energy management system remote from and in communication with said load power devices,
  wherein said load power devices and said remote energy management system form a zonal communication network; and wherein each of said load power devices has a unique identifier to associate a corresponding workspace with a specific occupant for selecting load management and control policies.

* * * * *